United States Patent
Atohira

(10) Patent No.: US 11,446,822 B2
(45) Date of Patent: Sep. 20, 2022

(54) SIMULATION DEVICE THAT SIMULATES OPERATION OF ROBOT

(71) Applicant: Fanuc Corporation, Yamanashi (JP)

(72) Inventor: Hiroyuki Atohira, Yamanashi (JP)

(73) Assignee: Fanuc Corporation, Yamanashi (JP)

(*) Notice: Subject to any disclaimer, the term of this patent is extended or adjusted under 35 U.S.C. 154(b) by 179 days.

(21) Appl. No.: 16/266,747

(22) Filed: Feb. 4, 2019

(65) Prior Publication Data
US 2019/0255706 A1 Aug. 22, 2019

(30) Foreign Application Priority Data
Feb. 19, 2018 (JP) .............................. JP2018-027331

(51) Int. Cl.
*B25J 9/16* (2006.01)
*G06F 30/20* (2020.01)

(52) U.S. Cl.
CPC ........... *B25J 9/1671* (2013.01); *B25J 9/1605* (2013.01); *B25J 9/1697* (2013.01); *G06F 30/20* (2020.01)

(58) Field of Classification Search
CPC ...... B25J 9/1671; B25J 9/1697; B25J 9/1605; B25J 9/00; B25J 19/00; B25J 19/023; G06F 30/20; G05B 2219/40323
See application file for complete search history.

(56) References Cited

U.S. PATENT DOCUMENTS

| | | | |
|---|---|---|---|
| 4,238,147 A * | 12/1980 | Stern | G03B 35/08 356/606 |
| 9,470,515 B2 | 10/2016 | Oumi | |
| 9,529,945 B2 | 12/2016 | Atohira et al. | |
| 2003/0090483 A1* | 5/2003 | Watanabe | G05B 19/4069 345/419 |
| 2007/0213874 A1* | 9/2007 | Oumi | B25J 9/1697 700/245 |

(Continued)

FOREIGN PATENT DOCUMENTS

| | | | |
|---|---|---|---|
| CN | 106041937 A | * 10/2016 | ............ B25J 9/1697 |
| DE | 102015106936 A1 | 11/2015 | |

(Continued)

OTHER PUBLICATIONS

CN-106041937-A translation (Year: 2016).*

*Primary Examiner* — Jeff A Burke
*Assistant Examiner* — Kyle T Johnson
(74) *Attorney, Agent, or Firm* — RatnerPrestia

(57) ABSTRACT

A simulation device simulates a robot device including two two-dimensional cameras. The simulation device includes a setting point arrangement unit which arranges a plurality of setting points on a surface of a workpiece model, and a distance calculation unit which calculates distances from a three-dimensional sensor model to each of the setting points. The simulation device includes a three-dimensional information generating unit which generates three-dimensional information including positions of the setting points and distances from the three-dimensional sensor model to the setting points. The simulation device includes an exclusion unit which excludes the setting point that is not visible from the camera models. The simulation device changes a position and orientation of a robot model on the basis of the three-dimensional information.

4 Claims, 16 Drawing Sheets

(56) References Cited

U.S. PATENT DOCUMENTS

| | | | | |
|---|---|---|---|---|
| 2010/0063616 | A1* | 3/2010 | Mori | G05B 19/406 |
| | | | | 700/160 |
| 2011/0218776 | A1* | 9/2011 | Shono | G06F 30/00 |
| | | | | 703/1 |
| 2015/0262346 | A1* | 9/2015 | Horita | G06T 3/00 |
| | | | | 348/137 |
| 2016/0203799 | A1* | 7/2016 | Sonoda | B25J 9/1697 |
| | | | | 700/259 |
| 2017/0151673 | A1* | 6/2017 | Kobayashi | H04N 5/247 |
| 2017/0256046 | A1* | 9/2017 | Watanabe | B25J 9/1612 |
| 2017/0370706 | A1 | 12/2017 | Nakatsukasa | |
| 2018/0250820 | A1* | 9/2018 | Shimodaira | B25J 9/1697 |
| 2018/0250823 | A1* | 9/2018 | Shimodaira | B25J 9/1671 |
| 2018/0253516 | A1* | 9/2018 | Shimano | B25J 9/1697 |
| 2018/0338090 | A1* | 11/2018 | Iida | G06T 7/73 |
| 2019/0255706 | A1* | 8/2019 | Atohira | B25J 9/1605 |
| 2019/0329405 | A1* | 10/2019 | Atohira | B25J 9/1605 |
| 2020/0148489 | A1* | 5/2020 | Diankov | B65G 59/02 |

FOREIGN PATENT DOCUMENTS

| | | |
|---|---|---|
| EP | 1315056 A2 | 5/2003 |
| EP | 1832947 A2 | 9/2007 |
| EP | 1864764 B1 | 11/2011 |
| EP | 3173194 A1 | 5/2017 |
| JP | 2005004391 A | 1/2005 |
| JP | 2010-071743 A | 4/2010 |
| JP | 2015171745 A | 10/2015 |
| JP | 2015215259 A | 12/2015 |
| JP | 5897624 B2 | 3/2016 |
| JP | 2016219935 A | 12/2016 |
| JP | 2017100214 A | 6/2017 |
| JP | 2017-170567 A | 9/2017 |

* cited by examiner

SIMULATION DEVICE THAT SIMULATES OPERATION OF ROBOT

CROSS-REFERENCE TO RELATED APPLICATIONS

This application is a new U.S. Patent Application that claims benefit of Japanese Patent Application No. 2018-027331, filed Feb. 19, 2018, the disclosure of this application is being incorporated herein by reference in its entirety for all purposes.

BACKGROUND OF THE INVENTION

1. Field of the Invention

This invention relates to a simulation device that simulates an operation of a robot.

2. Description of the Related Art

A robot device including a robot and an operation tool can perform an operation such as transporting a workpiece by changing a position and orientation of the robot. For example, there are known a robot device configured to retrieve a workpiece stacked in a container (e.g., Japanese Laid-open Patent Publication No. 2017-170567 A and Japanese Laid-open Patent Publication No. 2010-71743 A). In such a robot device, the position and orientation of the workpiece can be detected by using an image of the workpiece captured by a camera. The robot device can perform an operation on the workpiece by changing the position and orientation of the robot in accordance with the position and orientation of the workpiece.

Further, there are known a simulation device which implements a simulation in a robot device including a camera for detecting the position and orientation of a workpiece before the robot device performs an actual operation (e.g., Japanese Patent No. 5897624 B).

SUMMARY OF THE INVENTION

A simulation device simulates a robot device, making it possible to determine whether or not the robot device performs a desired operation. Further, the simulation device can evaluate an operation program which drives the robot device before the robot device performs the actual operation. An operator can then change the position of a device in a space where the operation is to be performed, change the operation tool, or correct the operation program on the basis of a simulation result.

The simulation devices in the related art can implement the simulation by arranging models such as a robot model corresponding to a robot and a workpiece model corresponding to a workpiece in a virtual space. Thus, the simulation device sometimes detects a portion of the workpiece which is not actually visible from the camera so as to implement the simulation. As a result, a distance image obtained in the simulation may differ from a distance image obtained by the actual robot device, resulting in the problem of deterioration in simulation accuracy.

For example, in the actual robot device, the position and orientation of the workpiece may not be detected because a portion of the workpiece cannot be captured by the camera. As a result, there is a case in which the workpiece cannot be transported by the robot device. Nevertheless, in the simulation device, the calculation is performed even for a portion which cannot be captured by the camera, and thus there is a case in which a simulation is performed so that the workpiece can be transported by the robot device.

A simulation device according to an aspect of the present disclosure simulates an operation performed on a workpiece by a robot on the basis of three-dimensional information of the workpiece obtained by a three-dimensional sensor provided with two two-dimensional cameras. The simulation device includes a model generating unit which generates a robot model expressing the robot three-dimensionally, a workpiece model expressing the workpiece three-dimensionally, and a three-dimensional sensor model including camera models expressing the two-dimensional cameras three-dimensionally, in a virtual space. The simulation device includes a setting point arrangement unit which arranges a plurality of setting points on a surface of the workpiece model, and a distance calculation unit which calculates distances from the three-dimensional sensor model to each of the setting points. The simulation device includes a three-dimensional information generating unit which generates three-dimensional information including positions of the setting points and distances from the three-dimensional sensor model to the setting points. The simulation device includes an exclusion unit which excludes, among the setting points arranged on the surface of the workpiece model, the setting point which is not visible from at least one of the camera models. The simulation device includes a workpiece position calculation unit which calculates a position and orientation of the workpiece model on the basis of the three-dimensional information. The simulation device includes a simulation execution unit which changes a position and orientation of the robot model and implements simulation of an operation performed on the workpiece model on the basis of the position and orientation of the workpiece model.

DETAILED DESCRIPTION

A simulation device of an embodiment will be described with reference to FIG. 1 to FIG. 19. In the present embodiment, a robot device including a robot and an operation tool attached to the robot implements a predetermined operation. The simulation device of the present embodiment simulates an operation to be performed on a workpiece by the robot. Further, in the present embodiment, a description is given by using a robot device configured to transport a workpiece as an example.

Figure 1:
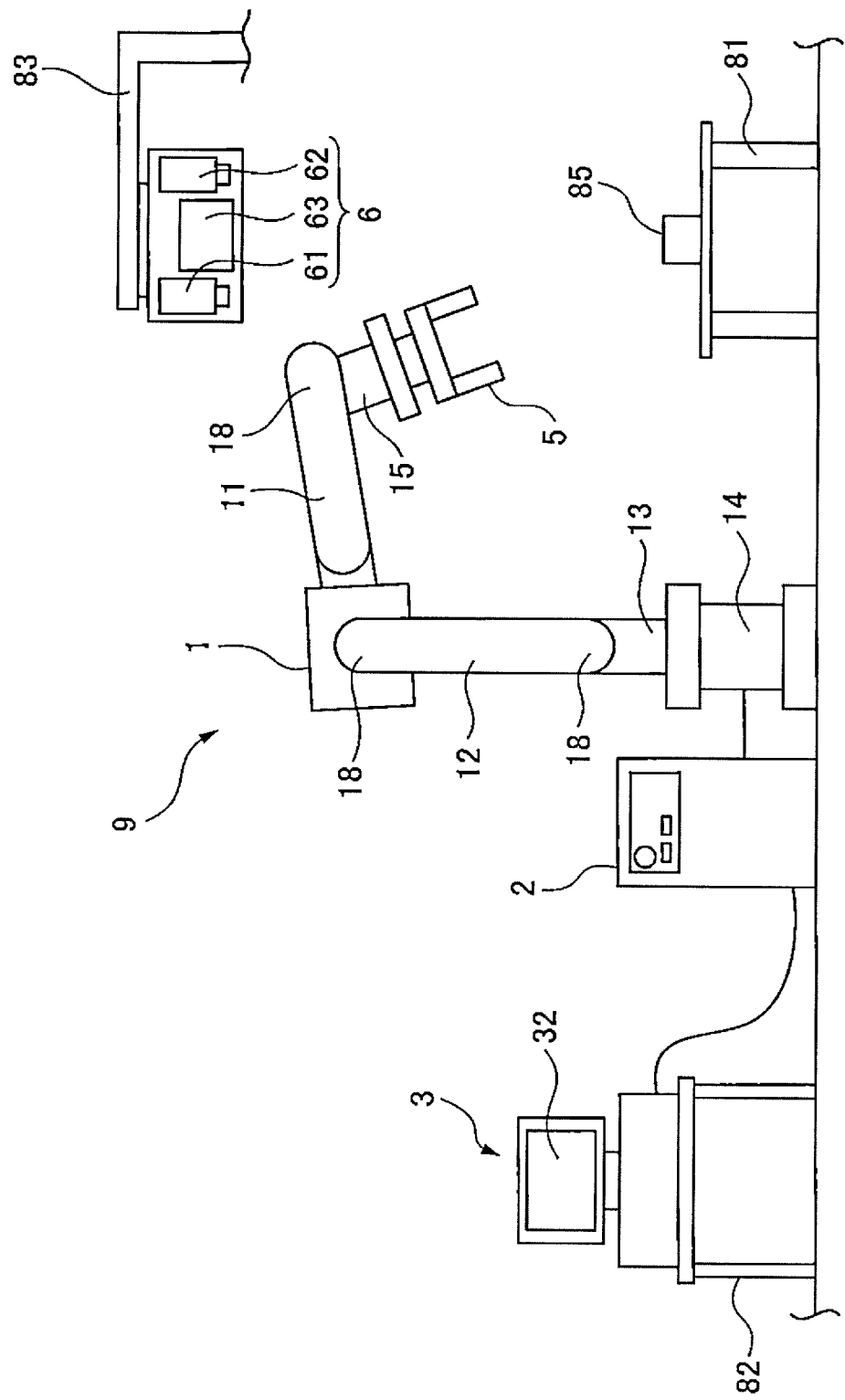
FIG. 1 is a schematic view of a robot device and a simulation device of an embodiment.

FIG. 1 is a schematic view of the robot device and the simulation device of the present embodiment. A robot device 9 includes a hand 5 which grips a workpiece 85, and a robot 1 which moves the hand 5. The robot device 9 includes a range sensor 6 serving as a three-dimensional sensor which captures an image of the workpiece 85 in order to detect a position and orientation of the workpiece 85. This robot device 9 includes a controller 2 which controls the robot 1 and the hand 5. The controller 2 of the present embodiment controls the range sensor 6 as well.

The hand 5 of the present embodiment is an operation tool (end effector) which grips and releases the workpiece 85. The operation tool attached to the robot 1 is not limited to this mode, and any operation tool corresponding to the operation to be performed by the robot device 9 can be utilized. For example, an operation tool which welds the workpiece, an operation tool which arranges a sealing member on a surface of the workpiece, or the like may be used.

The robot 1 of the present embodiment is an articulated robot including a plurality of joints 18. The robot 1 includes an upper arm 11 and a lower arm 12. The lower arm 12 is supported by a rotation base 13. The rotation base 13 is supported by a base 14. The robot 1 includes a wrist 15 connected to an end portion of the upper arm 11. Each of the constituent members of the robot 1 is formed so as to rotate around a predetermined drive axis. The robot is not limited to this mode, and any robot capable of moving an operation tool may be used.

The controller 2 includes an arithmetic processing device (computer) including a central processing unit (CPU), a random access memory (RAM), a read only memory (ROM), and the like. The CPU is connected with the RAM and the ROM through a bus. An operation program created in advance is input into the controller 2 in order to control the robot device 9 and the range sensor 6. The robot 1 drives on the basis of actuation commands of the controller 2. The robot device 9 automatically transports the workpiece 85 on the basis of the operation program.

The workpiece 85 is arranged on a surface of a pedestal 81. The range sensor 6 is disposed in a position which allows an image of the workpiece 85 to be captured. In the present embodiment, the range sensor 6 is disposed above the pedestal 81. The range sensor 6 is supported by a support member 83.

The range sensor 6 of the present embodiment includes two two-dimensional cameras 61, 62. The two two-dimensional cameras 61, 62 are disposed apart from each other. Two-dimensional cameras 61, 62 are cameras which can capture two-dimensional images. As the two two-dimensional cameras 61, 62, any camera including an image sensor such as a charge-couple device (CCD) sensor or a complementary metal-oxide semiconductor (CMOS) sensor can be used. The relative positions of the two two-dimensional cameras 61, 62 are predetermined.

The range sensor 6 of the present embodiment includes a projector 63 which projects a pattern light toward the workpiece 85. The projector 63 includes a light source such as a laser diode or a light-emitting diode. The projector 63 of the present embodiment projects a stripe pattern light onto the workpiece 85.

The range sensor 6 of the present embodiment captures images of the workpiece 85 by using the two two-dimensional cameras 61, 62. The controller 2 has a function of processing the images captured by the two-dimensional cameras 61, 62. The controller 2 can generate three-dimensional information of the workpiece 85 by a stereo method. The controller 2 calculates a distance to a predetermined portion of the workpiece 85 on the basis of a parallax between the two images captured by the two two-dimensional cameras 61, 62. Note that an arithmetic processing device which processes the images captured by the two-dimensional cameras 61, 62 may be arranged separately from the controller 2.

The three-dimensional information includes information related to a position of a predetermined point and a distance from the range sensor to the predetermined point. The three-dimensional information includes a distance image or a three-dimensional map. The distance image is an image which changes a brightness or a color of a pixel of the image in accordance with a distance. The three-dimensional map expresses measurement points by using sets of coordinate values (x, y, z) of a predetermined coordinate system and distances. Thus, in the present embodiment, the information of the workpiece 85 obtained by output of the three-dimensional sensor and expressed three-dimensionally is referred to as three-dimensional information.

The controller 2 detects the position and orientation of the workpiece 85 on the basis of the three-dimensional information obtained from the images of the range sensor 6. Then, the controller 2 changes a position and orientation of the robot 1 in accordance with the position and orientation of the workpiece 85. Subsequently, the hand 5 grips the workpiece 85. Next, the controller 2 changes the position and orientation of the robot 1 so as to transport the workpiece 85 to a desired position.

A simulation device 3 of the present embodiment includes an arithmetic processing device (computer) which includes a CPU, a RAM, and the like. The simulation device 3 includes a display unit 32 which displays a status during simulation execution, results, and the like. The display unit 32 may be configured by a liquid crystal display panel or the like. The simulation device 3 of the present embodiment is connected by a communication line so as to perform mutual communication with the controller 2. The simulation device 3 can obtain the operation program from the controller 2. Alternatively, the simulation device 3 can send the operation program revised by the simulation device 3 to the controller 2. Note that the simulation device 3 may not be connected with the controller 2. The simulation device 3 of the present embodiment is placed on a pedestal 82.

Figure 2:
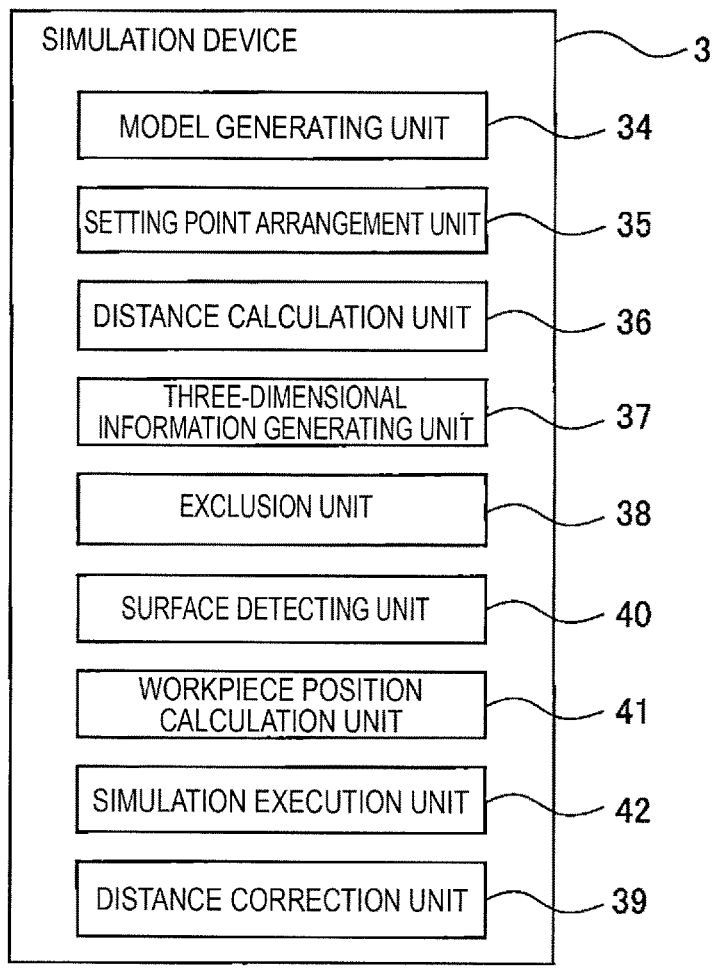
FIG. 2 is a block diagram of the simulation device of the embodiment.
Figure 3:
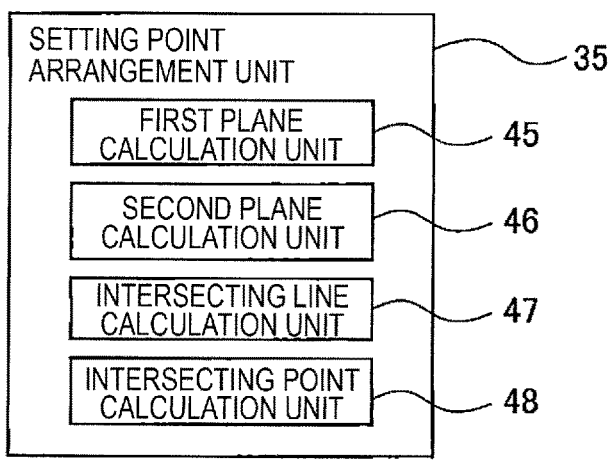
FIG. 3 is a block diagram of a setting point arrangement unit of the embodiment.
Figure 4:
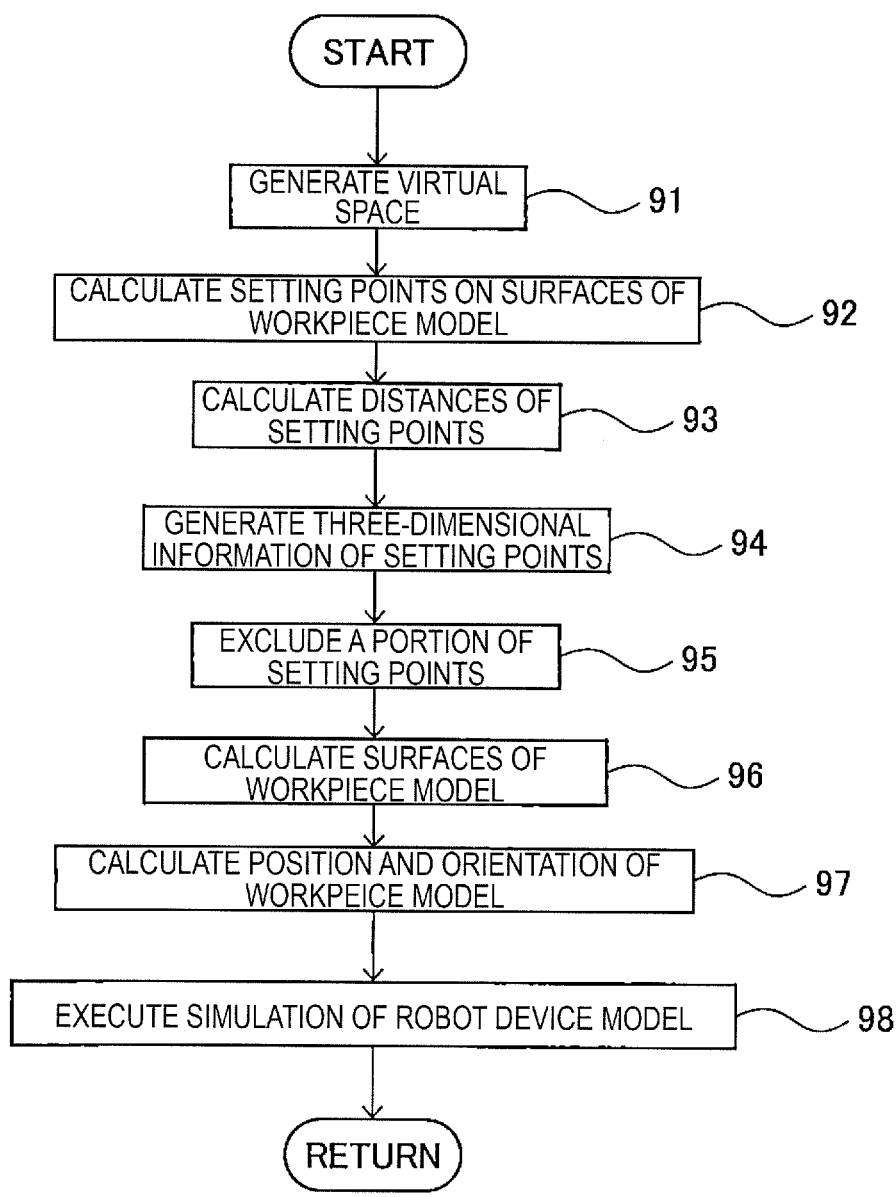
FIG. 4 is a flowchart of control of simulation of the embodiment.

FIG. 2 illustrates a block diagram of the simulation device of the present embodiment. FIG. 3 illustrates a block diagram of a setting point arrangement unit of the simulation device of the present embodiment. FIG. 4 illustrates a flowchart of the control for implementing a simulation of the present embodiment.

With reference to FIG. 2 to FIG. 4, the simulation device 3 includes a model generating unit 34 which generates models of members included in the robot device 9 and a model of the workpiece 85. In step 91, the model generating unit 34 generates a virtual space where members to be simulated are arranged. The model generating unit 34 arranges the models of the members related to the simulation in the virtual space. The simulation device 3 displays this virtual space on the display unit 32. Further, the display unit 32 displays a result of the simulation. For example, an operation in which the position and orientation of the robot are changed is displayed on the display unit 32.

A worker inputs three-dimensional models of the robot device 9 and the workpiece 85 into the simulation device 3 in advance. For example, three-dimensional data generated by a computer aided design (CAD) device can be used as the three-dimensional model. The three-dimensional data includes, for example, shape data of the members. The model generating unit 34 uses the three-dimensional data input in advance in order to generate a model of each of the members.

Figure 5:
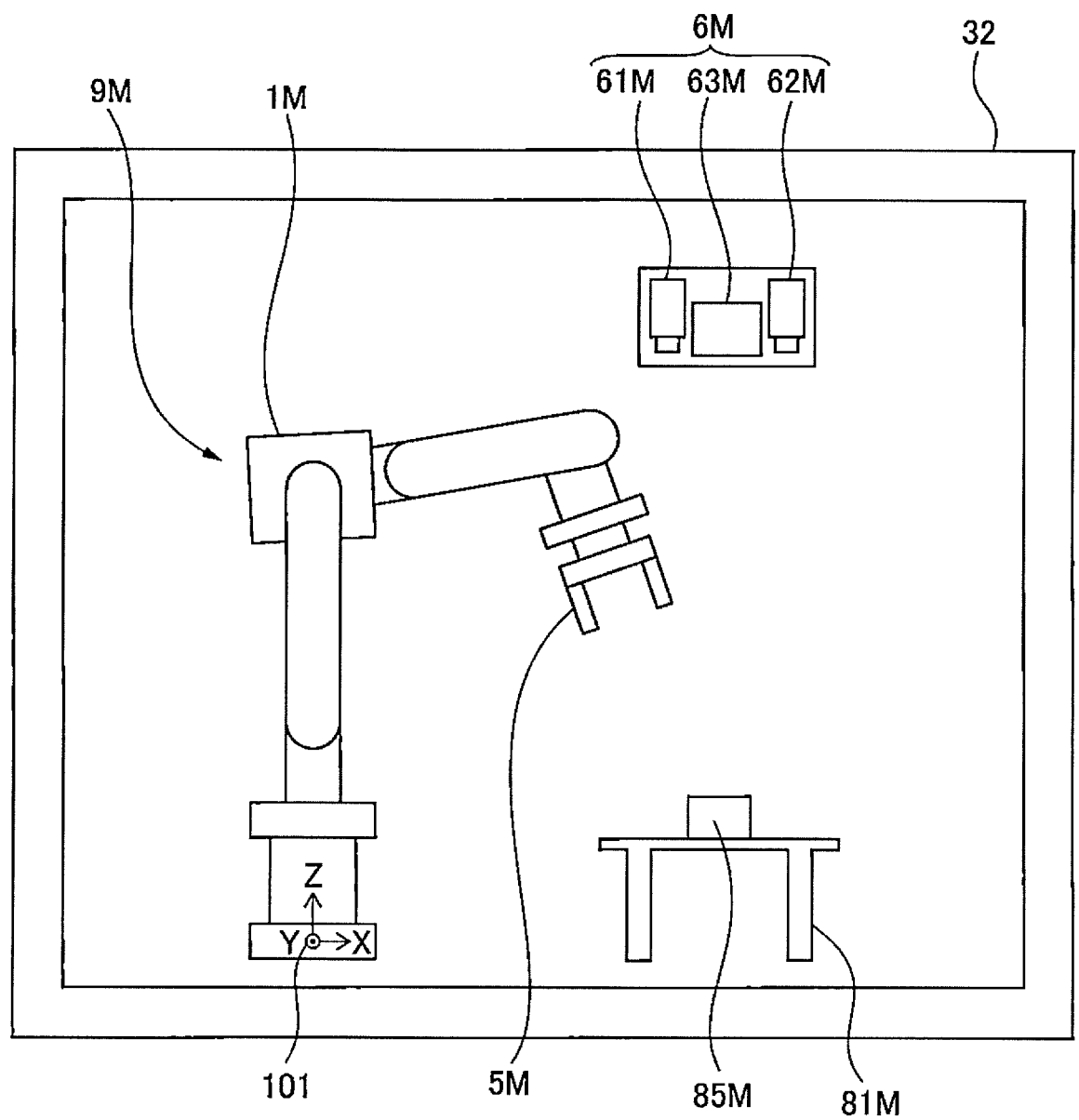
FIG. 5 is an example of an image displayed on a display unit of the simulation device.

FIG. 5 illustrates an example of an image of the virtual space displayed on the display unit of the simulation device in the present embodiment. The model generating unit 34 generates a robot device model 9M expressing the robot device 9 three-dimensionally. The model generating unit 34 generates a robot model 1M expressing the robot 1 three-dimensionally. The model generating unit 34 generates a hand model 5M serving as an operation tool model expressing the hand 5 three-dimensionally. The model generating unit 34 generates a range sensor model 6M serving as a three-dimensional sensor model expressing the range sensor 6 three-dimensionally. The range sensor model 6M includes camera models 61M, 62M expressing the two-dimensional cameras 61, 62 three-dimensionally, and a projector model 63M expressing the projector 63 three-dimensionally.

The model generating unit 34 generates a workpiece model 85M expressing the workpiece 85 three-dimensionally, and a pedestal model 81M expressing the pedestal 81 on which the workpiece 85 is placed three-dimensionally. The model generating unit 34 arranges the robot device model 9M and the workpiece model 85M in the virtual space. The relative positions of the models of the members in the robot device and the workpiece model 85M correspond to the relative positions of the actual members in the robot device 9 and the actual workpiece 85.

The model generating unit 34 sets a world coordinate system including an origin 101 in the virtual space. The world coordinate system is a coordinate system in which the origin 101 and an orientation of the coordinate axes do not change even when the position and orientation of the robot model 1M change. For example, the position of the robot device model 9M and the position of the workpiece model 85M in the virtual space can be expressed by using coordinate values of the world coordinate system.

Note that, in FIG. 5, while the display unit 32 displays the robot device model 9M, the workpiece model 85M, and the like in a two-dimensional image, the display unit is not limited to this mode. The display unit may be formed so that the worker changes the viewpoint by using an input device and confirms the positional relationship between the models of the members in a three-dimensional image.

With reference to FIG. 2 to FIG. 4, the simulation device 3 includes a setting point arrangement unit 35 which arranges a plurality of setting points on a surface of the workpiece model 85M. In step 92, the setting point arrangement unit 35 arranges the setting points on all surfaces of the workpiece model 85M.

Figure 6:
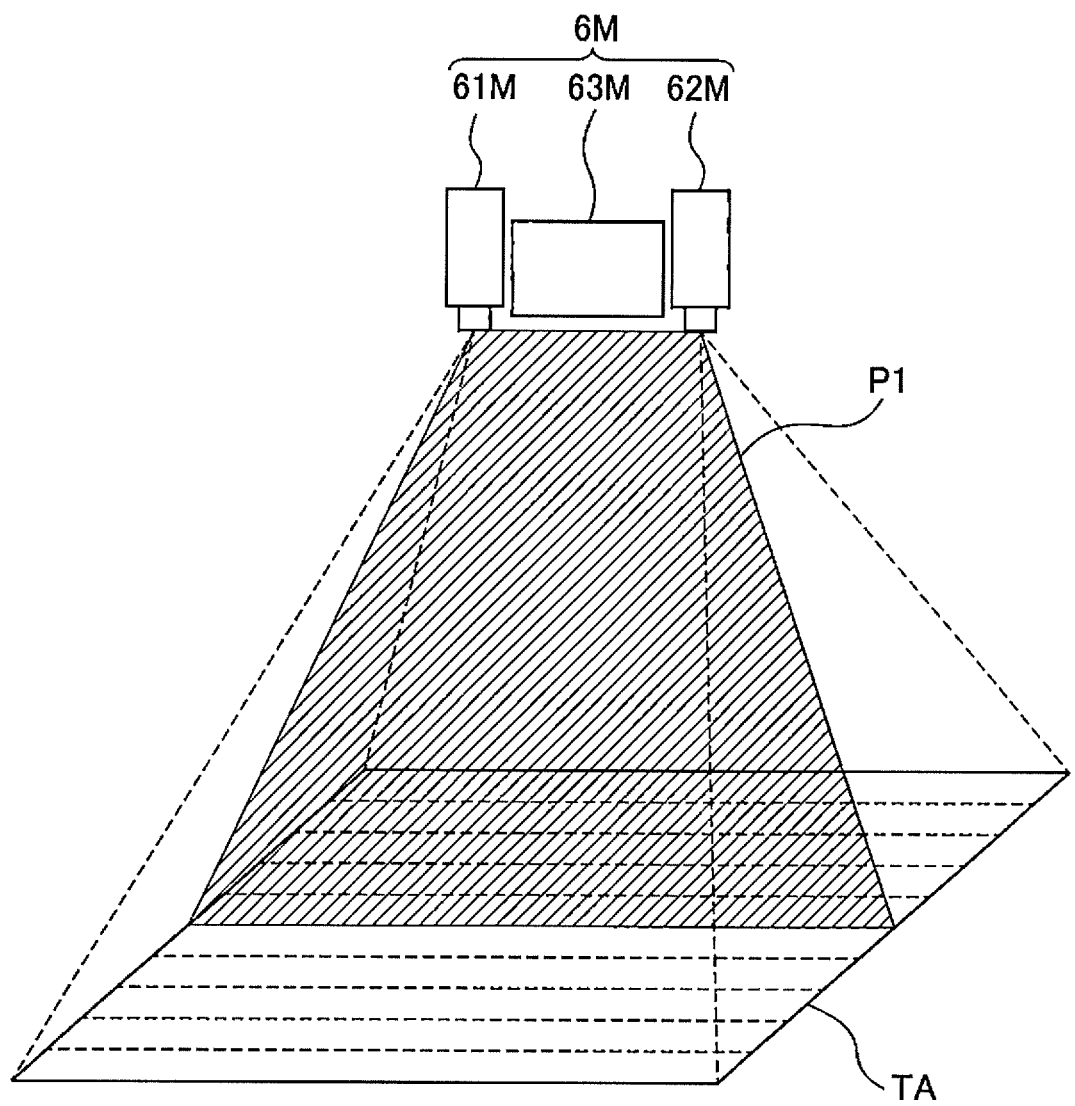
FIG. 6 is a perspective view of a model for explaining a first plane for calculating setting points in the simulation.

FIG. 6 illustrates a perspective view for explaining a first plane for arranging the setting points. With reference to FIG. 3 and FIG. 6, the setting point arrangement unit 35 includes a first plane calculation unit 45 which calculates a first plane. The setting point arrangement unit 35 sets a measurement region TA with respect to the range sensor model 6M. The measurement region TA is defined as, for example, a plane which is parallel to a line connecting lens center points of the two camera models 61M, 62M and orthogonal to optical axes of the two camera models 61M, 62M. Alternatively, the measurement region TA can be generated on a plane which is orthogonal to an optical axis of the projector model 63M. In the present embodiment, the measurement region TA is formed in a position which is apart from the range sensor model 6M by a predetermined distance. Additionally, the measurement region TA is formed to a predetermined size.

The measurement region TA of the present embodiment is divided by lines which are parallel to the line connecting the lens center points of the two camera models 61M, 62M. The measurement region TA is divided at equal intervals by a plurality of dividing lines. A first plane P1 of the present embodiment includes the line connecting the lens center points of the two camera models 61M, 62M and the dividing line. The first plane calculating unit 45 generates a plurality of the first planes P1 in correspondence with each of the dividing lines.

Figure 7:
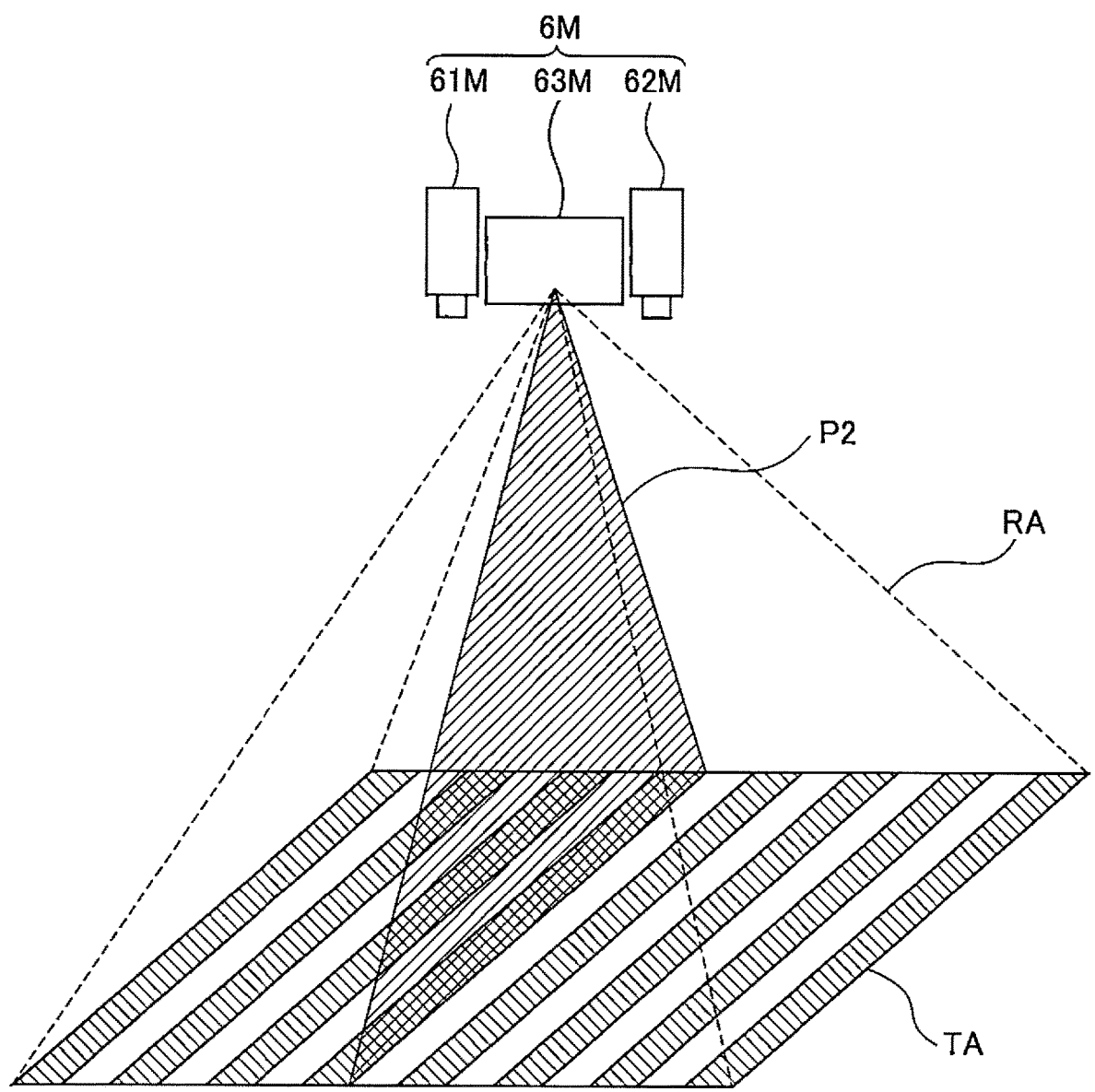
FIG. 7 is a perspective view of a model for explaining a second plane for calculating setting points in the simulation.

FIG. 7 illustrates a perspective view for explaining a second plane for arranging the setting points. With reference to FIG. 3 and FIG. 7, the setting point arrangement unit 35 includes a second plane calculation unit 46 which calculates a second plane. The projector model 63M of the present embodiment projects a stripe pattern light. In the measurement region TA, boundary lines between bright portions and dark portions are formed. A second plane P2 is a plane passing through this boundary line and the lens center point of the projector model 63M. The second plane calculation unit 46 generates the second plane P2 at each boundary line of the stripe pattern light. The second plane calculation unit 46 generates a plurality of the second planes P2. Note that the dividing lines of the measurement region TA illustrated in FIG. 6 are set so as to be orthogonal to the boundary lines of the stripe pattern light projected by the projector model 63M.

Figure 8:
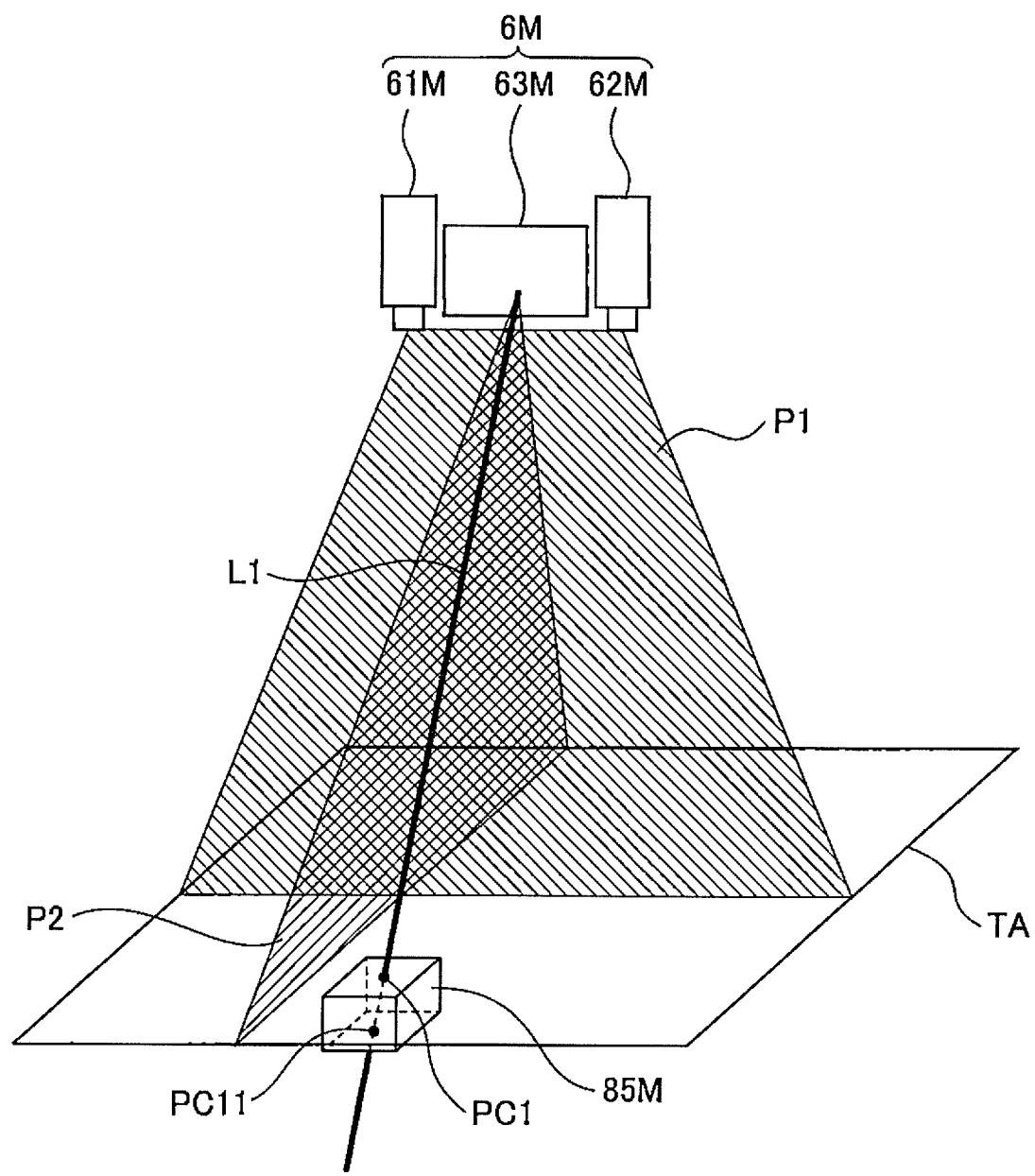
FIG. 8 is a perspective view for explaining an intersecting line of the first plane and the second plane.

FIG. 8 illustrates a schematic view for explaining intersecting line of the first plane and the second plane. With reference to FIG. 3 and FIG. 8, the setting point arrangement unit 35 includes an intersecting line calculation unit 47 which calculates the intersecting lines of the first planes P1 and the second planes P2. The intersecting line calculation unit 47 calculates intersecting lines L1, which are the lines where the first planes P1 and the second planes P2 intersect.

The intersecting lines L1 can be expressed by an equation based on the world coordinate system, for example.

The setting point arrangement unit 35 includes an intersecting point calculation unit 48 which calculates each intersecting point of the workpiece model 85M and the intersecting lines L1. The intersecting point calculation unit 48 calculates the intersecting points of the intersecting lines L1 and the surfaces of the workpiece model 85M. The setting point arrangement unit 35 can define the intersecting points as the setting points PC1, PC11. The setting points PC1, PC11 can be expressed as coordinate values of the world coordinate system, for example.

Figure 9:
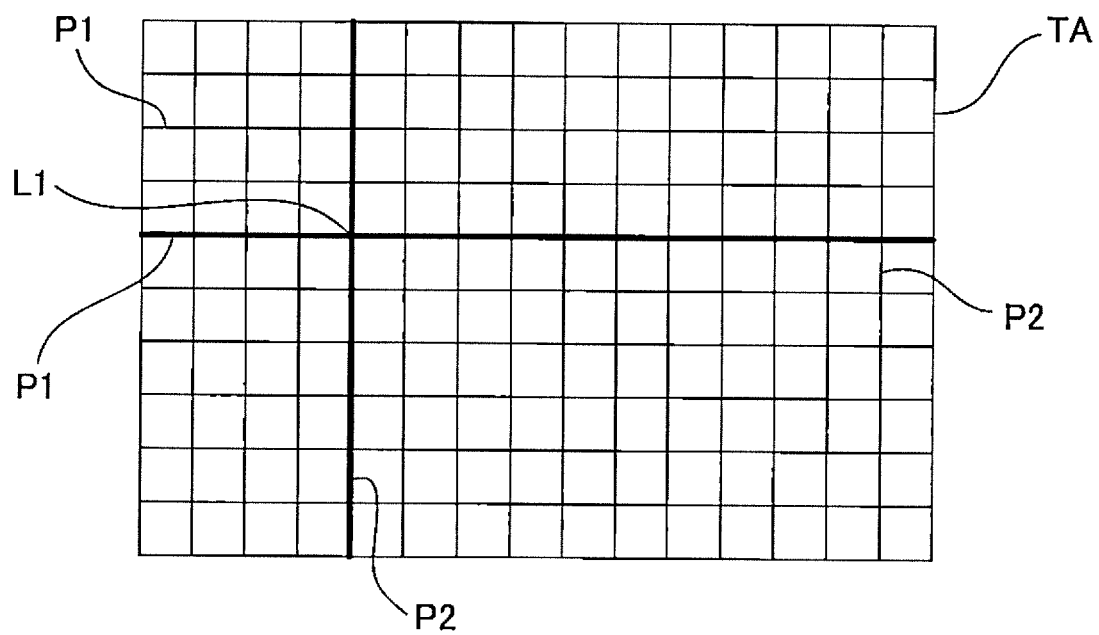
FIG. 9 is a diagram for explaining an intersecting line of a measurement region and the first plane, and an intersecting line of the measurement region and the second plane.

FIG. 9 illustrates a plan view for explaining lines where the measurement region and the first planes intersect, and lines where the measurement region and the second planes intersect. In the measurement region TA of the present embodiment, the first planes P1 and the second planes P2 are generated so as to orthogonally cross each other. A plurality of intersecting points of the first planes P1 and the second planes P2 are generated. The intersecting line calculation unit 47 calculates a plurality of the intersecting lines L1 in such a way that these intersecting lines L1 pass through these intersecting points. The intersecting point calculation unit 48 calculates the intersecting points where the plurality of intersecting lines L1 cross the surfaces of the workpiece model 85M, making it possible to define these intersecting points as setting points.

Figure 10:
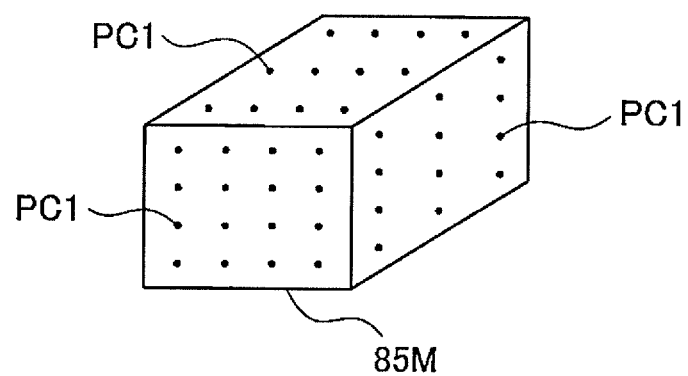
FIG. 10 is a perspective view of a workpiece model for explaining setting points arranged on surfaces of a workpiece by a setting point arrangement unit.

FIG. 10 illustrates a perspective view of the workpiece model for explaining the setting points arranged on the surfaces of the workpiece model. The setting point arrangement unit 35 arranges the setting points PC1 on all surfaces of the workpiece model 85M. In the present embodiment, the setting point arrangement unit 85 arranges the setting points PC1 on a top surface, side surfaces, and a base surface of the workpiece model 85M. When a plurality of workpiece models exist, the setting point arrangement unit 35 arranges setting points on the surfaces of all workpiece models.

Figure 11:
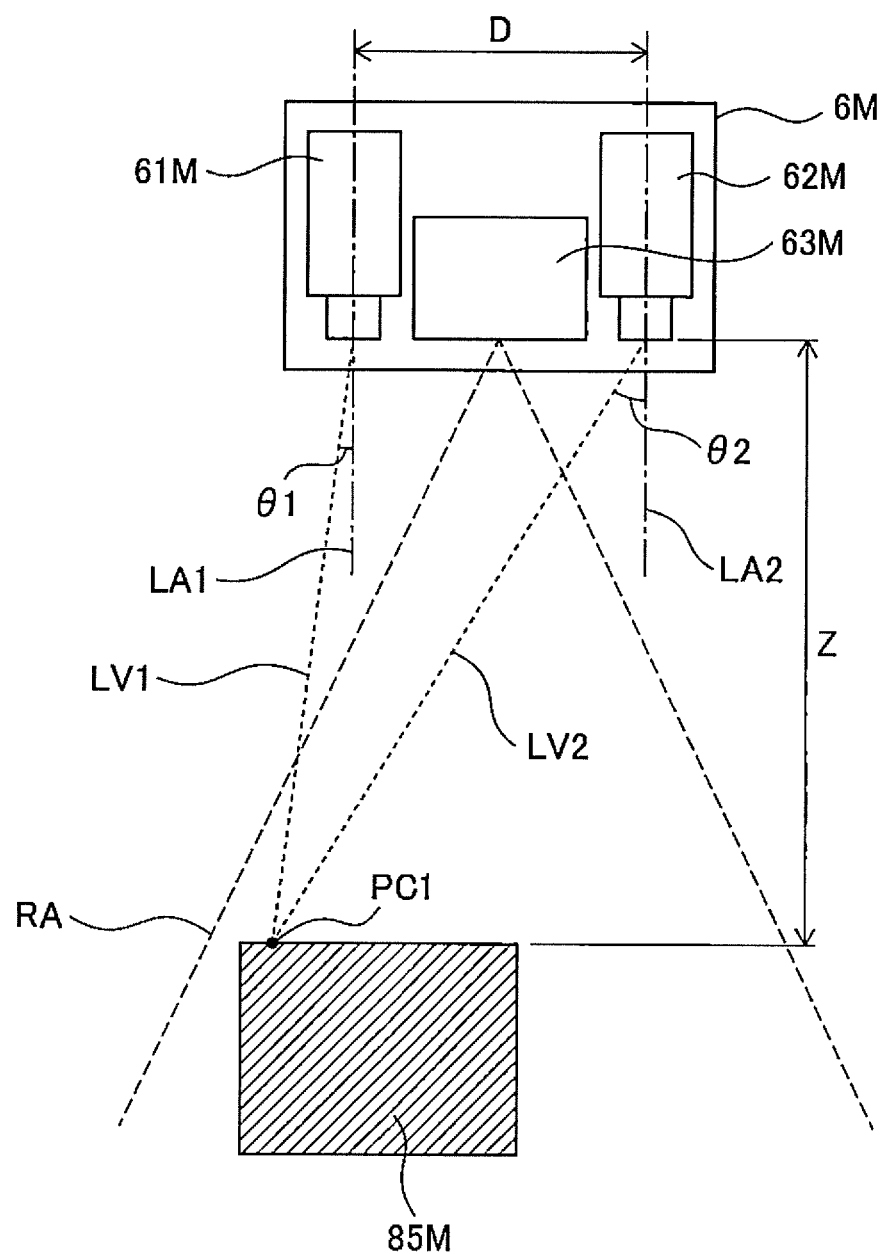
FIG. 11 is a schematic view for explaining calculation of a distance from a range sensor model to the workpiece model.

FIG. 11 illustrates a schematic view for explaining calculation of a distance from the range sensor model to the setting point of the workpiece model. With reference to FIG. 2, FIG. 4, and FIG. 11, the simulation device 3 includes a distance calculation unit 36 which calculates distances Z from the range sensor model 6M to the setting point PC1. In step 93, the distance calculation unit 36 calculates the distance Z from the range sensor model 6M to the setting point PC1 for each setting point PC1.

In the virtual space, the positions of the camera models 61M, 62M are predetermined. A distance D between the two camera models 61M, 62M is predetermined. Further, an optical axis LA1 of the camera model 61M and an optical axis LA2 of the camera model 62M are also predetermined. Thus, the distance calculation unit 36 can calculate an angle $\theta_1$ formed by a line of sight LV1 from the camera model 61M toward the setting point PC1, and the optical axis LA1. Similarly, the distance calculation unit 36 can calculate an angle $\theta_2$ formed by a line of sight LV2 from the camera model 62M toward the setting point PC1, and the optical axis LA2. By using the distance D and the angles $\theta_1$, $\theta_2$, the distance Z from the range sensor model 6M to the setting point PC1 can be calculated on the basis of Equation (1) below.

$$Z \tan \theta_2 D + Z \tan \theta_1 \quad (1)$$

As illustrated in FIG. 10, the plurality of setting points PC1 are arranged on the surfaces of the workpiece model 85M. The distance calculation unit 36 of the present embodiment calculates the distances Z with respect to all setting points PC1. With reference to FIG. 2 and FIG. 4, the simulation device 3 includes a three-dimensional information generating unit 37 which generates the three-dimensional information including the positions of the setting points and the distances from the range sensor model 6M to the setting points PC1. In step 94, the three-dimensional information generating unit 37 generates three-dimensional information related to the workpiece model 85M on the basis of the positions of the setting points PC1 and the distances Z from the range sensor model 6M to the setting points PC1.

The setting point arrangement unit 35 of the present embodiment arranges the setting points PC1 on all surfaces of the workpiece model 85M. In the virtual space, the setting points PC1 are arranged on all surfaces of the workpiece model 85M. However, in the actual workspace, a portion of the workpiece 85 which is not visible from at least one of the two-dimensional cameras 61, 62 exists.

The simulation device 3 of the present embodiment performs a control for excluding the setting points arranged in the portion which is not visible from at least one of the two-dimensional cameras 61, 62. With reference to FIG. 2 and FIG. 4, the simulation device 3 includes an exclusion unit 38 which excludes, among the plurality of setting points PC1 arranged on the surfaces of the workpiece model 85M, the setting points which are not visible from at least one of the camera models 61M, 62M. In step 95, the exclusion unit 38 excludes the setting points PC1 which are not visible from at least one of the camera models 61M, 62M from the three-dimensional information. That is, the exclusion unit 38 excludes the setting points PC1 arranged in a portion which cannot be captured by the actual two-dimensional cameras 61, 62.

Figure 12:
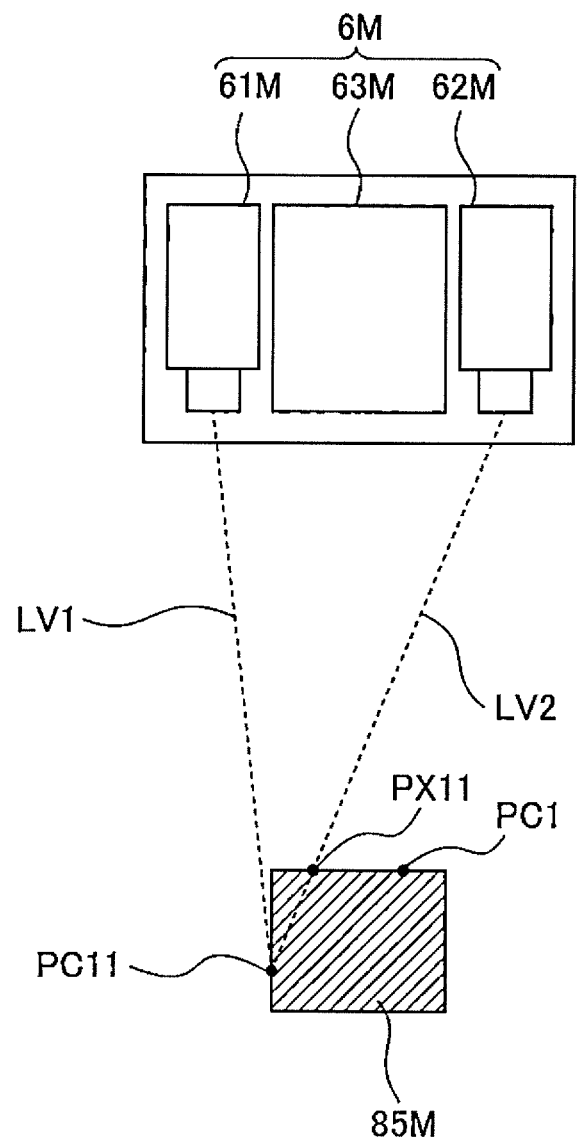
FIG. 12 is a first schematic view for explaining setting points arranged on surfaces of a workpiece.

FIG. 12 illustrates a schematic view of the range sensor model and the workpiece model for explaining a process of excluding the setting points. In the example illustrated in FIG. 12, the setting point PC1 can be seen from both the camera model 61M and the camera model 62M.

That is, when the workpiece 85 is captured by the two-dimensional camera 61 and the two-dimensional camera 62, the setting point PC1 is captured in both images. The setting point PC11 is arranged on a side surface of the workpiece model 85M. While the setting point PC11 can be viewed from the camera model 61M, the setting point PC11 cannot be viewed from the camera model 62M. The setting point PC11 is arranged on a dead angle of the top surface of the workpiece model 85M. The setting point PC11 is arranged in a portion which is not seen in the image captured by the actual two-dimensional camera 62 corresponding to the camera model 62M.

The exclusion unit 38 excludes the setting point PC11 which is not visible from the camera model 62M. In the present embodiment, the exclusion unit 38 calculates the line of sight LV1 from the camera model 61M toward the setting point PC11, and the line of sight LV2 from the camera model 62M toward the setting point PC11. The exclusion unit 38 can detect an intersecting point PX11 of the line of sight LV2 and the surface of the workpiece model 85M. The exclusion unit 38 can exclude the setting point PC11 when the intersecting point PX11 exists between the setting point PC11 and the camera model 62M.

Further, when an intersecting point exists for each line of sight and a surface of the workpiece model, and the setting point is a point closest to the camera model, the exclusion unit 38 allows the setting point to remain. On the other hand, when the intersecting point PX11 of the line of sight LV2 and the surface of the workpiece model 85M is closer to the camera model 62M than the setting point PC11, the exclusion unit 38 allows the setting point PC11 to be excluded. The exclusion unit 38 excludes the setting point PC11, including the information of the distance Z, from the three-dimensional information generated by the three-dimensional information generating unit 37.

Figure 13:
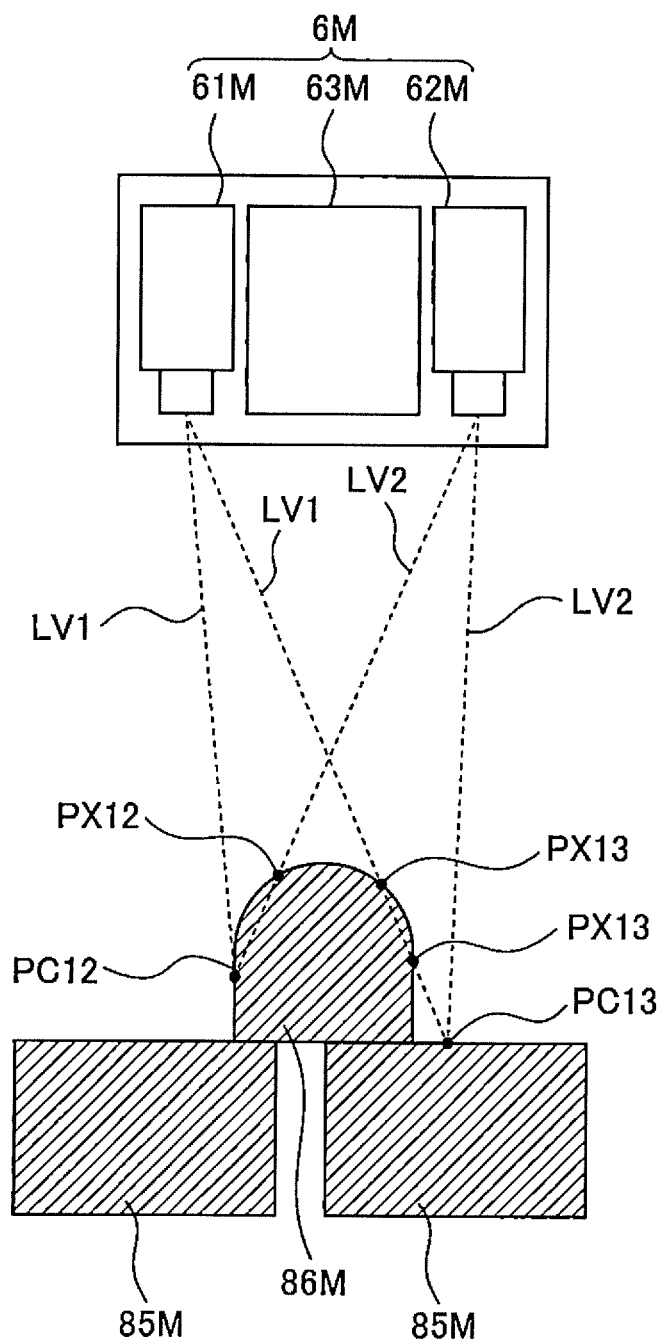
FIG. 13 is a second schematic view for explaining the setting points arranged on surfaces of the workpiece.

FIG. 13 illustrates a schematic view of the range sensor model and the workpiece model for explaining another example of exclusion of the setting point. In the example illustrated in FIG. 13, a workpiece model 86M is stacked on the workpiece models 85M. The workpiece model 86M has a curved top surface. For example, an intersecting point PX12 exists between the camera model 62M and an intersecting point PC12, and thus the setting point PC12 is excluded. Further, an intersecting points PX13 exists between the camera model 61M and a setting point PC13, and thus the setting point PC13 is excluded.

Thus, the control of the present embodiment can be implemented with respect to a workpiece model having any shape. Even when a plurality of workpieces are stacked, the control of the present embodiment can be implemented. The exclusion unit 38 of the present embodiment can exclude the setting point arranged in the portion which is not imaged when two-dimensional images are captured by the actual two-dimensional cameras 61, 62. Further, the exclusion unit 38 can exclude the setting point which is not visible from one of the camera models, and can exclude the setting point which is not visible from both camera models.

Figure 14:
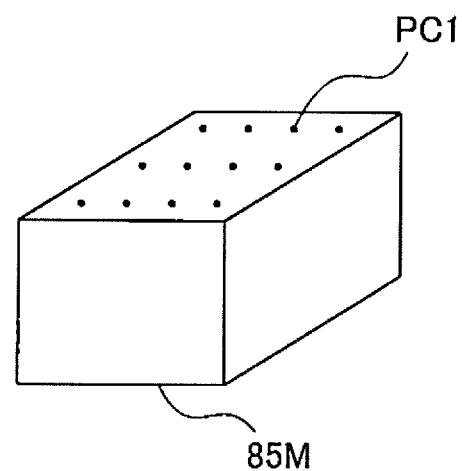
FIG. 14 is a perspective view of the workpiece model when a portion of setting points is excluded by an exclusion unit.

FIG. 14 illustrates a perspective view of the workpiece model after the exclusion unit excludes a portion of the setting points. FIG. 14 is a drawing after a portion of the setting points PC1 are excluded from the workpiece model 85M illustrated in FIG. 10. In this example, the setting points PC1 arranged on the side surfaces and the base surface of the workpiece model 85M are removed. Then, the setting points PC1 arranged on the top surface of the workpiece model 85M remain.

Figure 15:
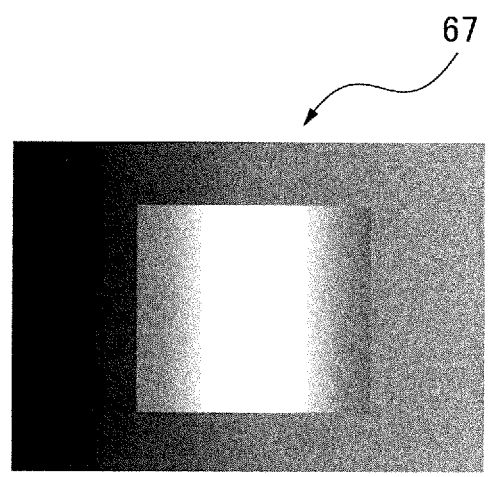
FIG. 15 is an example of a distance image obtained by the simulation device.

FIG. 15 illustrates an example of three-dimensional information after exclusion of the setting points by the exclusion unit. In the example in FIG. 15, a distance image 67 obtained by stacking the workpiece model in two stages is illustrated. A darkness of each pixel is determined in accordance with the distance Z from the range sensor model 6M to the workpiece model 85M. For example, the pixel can be set lighter as the distance to the range sensor model 6M decreases. By changing such a darkness of each pixel, it is possible to visually display the three-dimensional information. Note that, as described above, the three-dimensional information is not limited to a distance image, and may be information on a text format which includes information of the positions and distances of the setting points.

With reference to FIG. 2 to FIG. 4, the simulation device 3 includes a surface detecting unit 40 which detects each of the surfaces of the workpiece model 85M. In step 96, the surface detecting unit 40 detects each of the surfaces of the workpiece model 85M on the basis of the setting points PC1 arranged on the surface of the workpiece model 85M.

Figure 16:
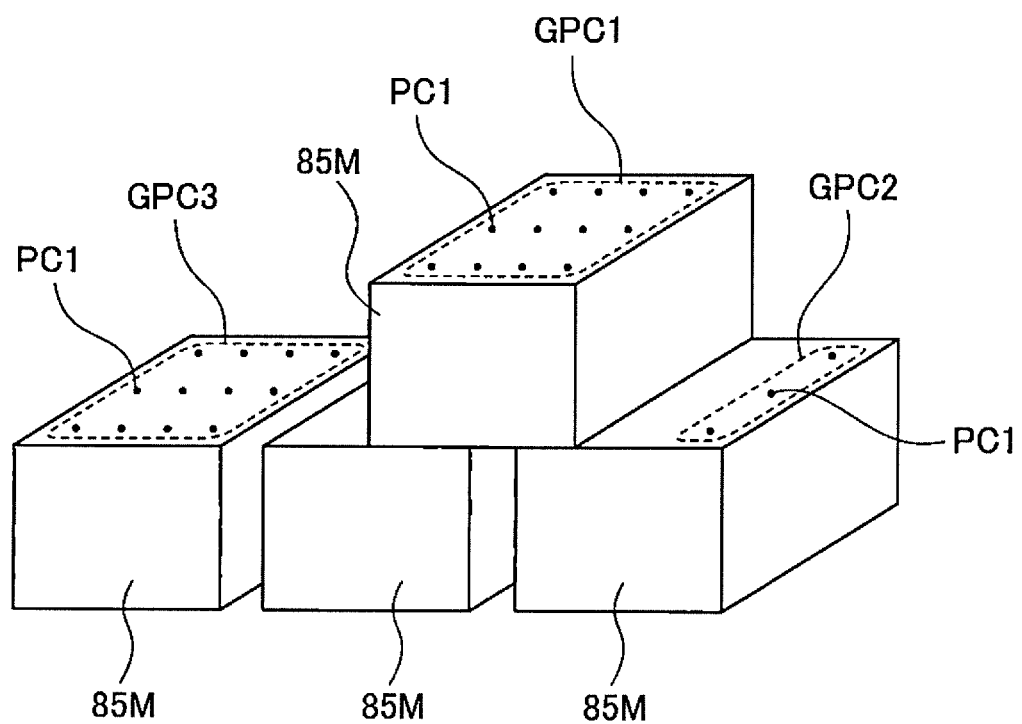
FIG. 16 is a perspective view of the workpiece models for explaining a control for detecting surfaces of the workpiece models.

FIG. 16 illustrates a perspective view of workpiece models for explaining the control for detecting the surfaces of the workpiece. In the example illustrated in FIG. 16, a plurality of the workpiece models 85M are arranged. The surface detecting unit 40 creates groups GPC1, GPC2, GPC3 of the setting points PC1 which are close to each other among the plurality of setting points PC1. For example, the surface detecting unit 40 generates a group of the setting points PC1 in which a distance between adjacent setting points PC1 is less than a determination value. In the example illustrated in FIG. 16, the groups GPC1, GPC2, GPC3 are formed. The surface detecting unit 40 detects one group as one surface of the workpiece model. When a plurality of the workpiece models 85M are present, the surface detecting unit 40 can generate a plurality of groups.

With reference to FIG. 2 and FIG. 4, the simulation device 3 includes a workpiece position calculation unit 41 which calculates the position and orientation of the workpiece model 85M on the basis of the three-dimensional information of the workpiece model 85M. In step 97, the workpiece position calculation unit 41 calculates the position and orientation of the workpiece model 85M on the basis of the groups GPC1, GPC2, GPC3 of the setting points PC1 arranged on each of the surfaces of the workpiece model 85M. For example, a position of a center of gravity of the workpiece model can be employed as the position of the workpiece model. Further, for example, a direction in which a line perpendicular to the surface of the workpiece extends can be employed as the orientation of the workpiece model.

Figure 17:
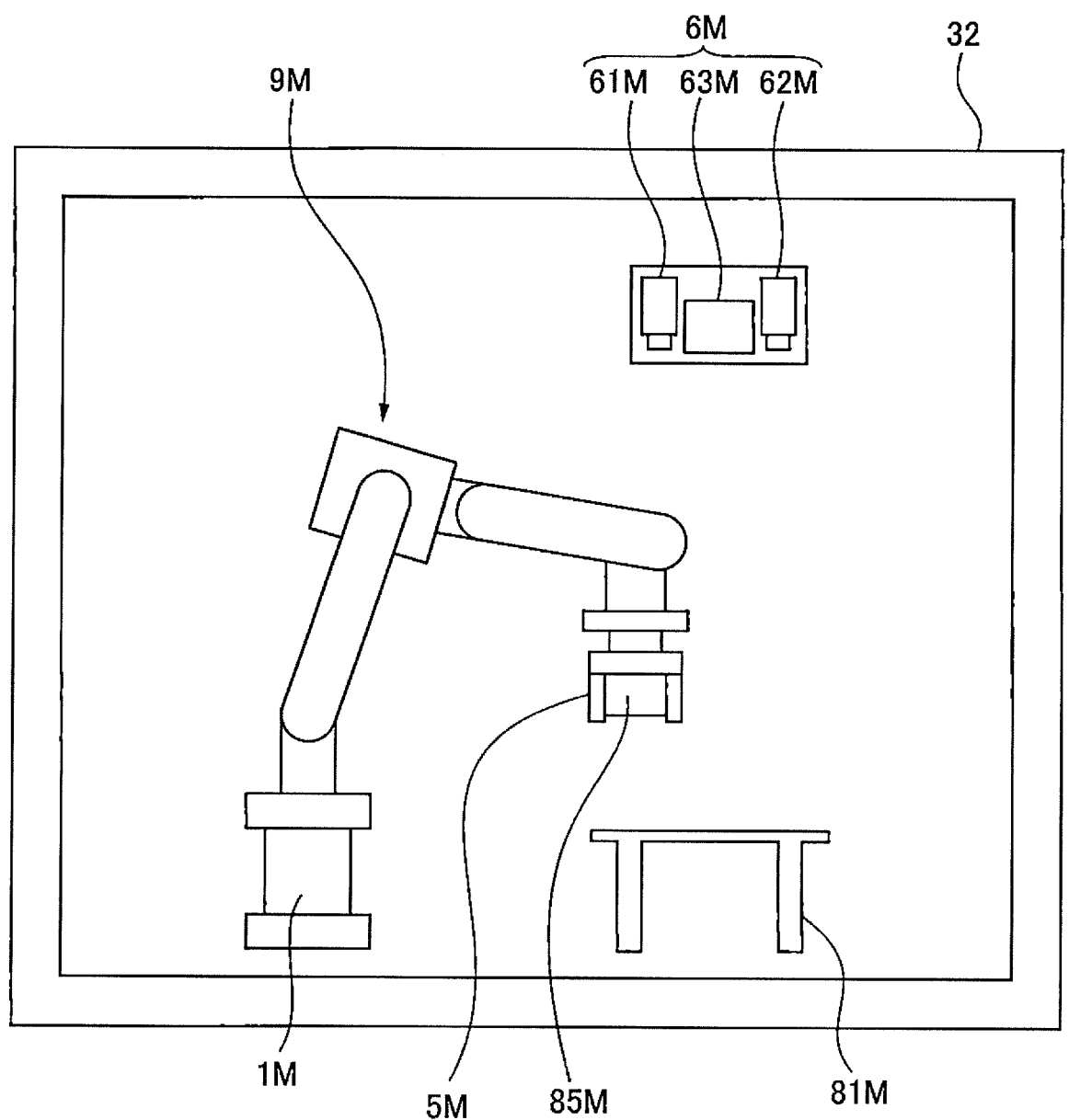
FIG. 17 is an example of an image displayed on a display unit when the simulation is executed.

FIG. 17 illustrates an example of an image of the display unit when a simulation of the robot device model is executed. With reference to FIG. 2, FIG. 4, and FIG. 17, the simulation device 3 includes a simulation execution unit 42 which implements a simulation of an operation performed on the workpiece model. In step 98, the simulation execution unit 42 executes a simulation of the robot device model 9M. The simulation execution unit 42 changes the position and orientation of the robot model 1M on the basis of the position and orientation of the workpiece model 85M calculated by the workpiece position calculation unit 41. By changing the position and orientation of the robot model 1M, the hand model 5M moves to the vicinity of the workpiece model 85M. Next, the hand model 5M grips the workpiece model 85M. Subsequently, the robot model 1M changes the position and orientation, and transports the workpiece model 85M to a desired position. In this way, the simulation of the robot device can be implemented.

In the actual robot device, a portion of the workpiece which cannot be captured by the two-dimensional cameras exists. In a simulation device in the related art, the calculation is performed for a portion of the workpiece which is not visible from the two-dimensional cameras as well, and thus the operation of the actual robot device and the operation of the robot device in the simulation may differ. Conversely, in the simulation device of the present embodiment, the setting points arranged on a portion which cannot be captured by the actual cameras are excluded, and thus simulation which is close to the operation of the actual robot device can be implemented. That is, the simulation device of the present embodiment can improve the accuracy of simulation.

In the above-described present embodiment, the exclusion unit 38 excludes the setting points which cannot be captured by the cameras by calculating the respective lines of sight LV1, LV2 of the camera models 61M, 62M. The control for excluding the setting point is not limited to this mode, however, and any control for excluding the setting point which is not visible by the camera models, that is, not captured by the actual cameras, may be implemented. Further, the exclusion unit may exclude at least a portion of the setting points among the plurality of setting points which are not visible from the camera models.

For example, in the control implemented by the exclusion unit 38, the intersecting line L1 extending from the lens center point of the projector model 63M as illustrated in FIG. 8 can be used. The exclusion unit 38 calculates the intersecting points of the surfaces of the workpiece model 85M. At this time, when the two setting points PC1, PC11 are detected as intersecting points on one intersecting line L1, the setting point PC11 other than the setting point PC1 which is closest to the projector model 63M can be excluded. Further, when another setting point PC1 exists between the setting point PC11 and the projector model 63M, the exclusion unit 38 can perform a control for excluding the setting point PC11 from the three-dimensional information. In this control, a large portion of the setting points which are not visible from at least one of the two-dimensional cameras 61, 62 can be excluded.

While the exclusion unit 38 of the present embodiment excludes the setting points which are not visible from the camera models from the three-dimensional information, the exclusion unit is not limited to this mode. The exclusion unit may exclude setting points which are not visible from the camera models before generation of the three-dimensional information. For example, a portion of the setting points may be excluded in a process immediately after the setting points are arranged on the surfaces of the workpiece model.

In this regard, a workpiece arranged outside visual fields of the two-dimensional cameras 61, 62 cannot be captured by the two-dimensional cameras 61, 62. Further, the position and orientation of a workpiece arranged in a region in which the pattern of the projector 63 cannot be projected may not be properly detected. The exclusion unit 38 of the present embodiment can exclude the setting point arranged outside a region in which the visual fields of the two camera model and the projection range of the projector model overlap.

Figure 18:
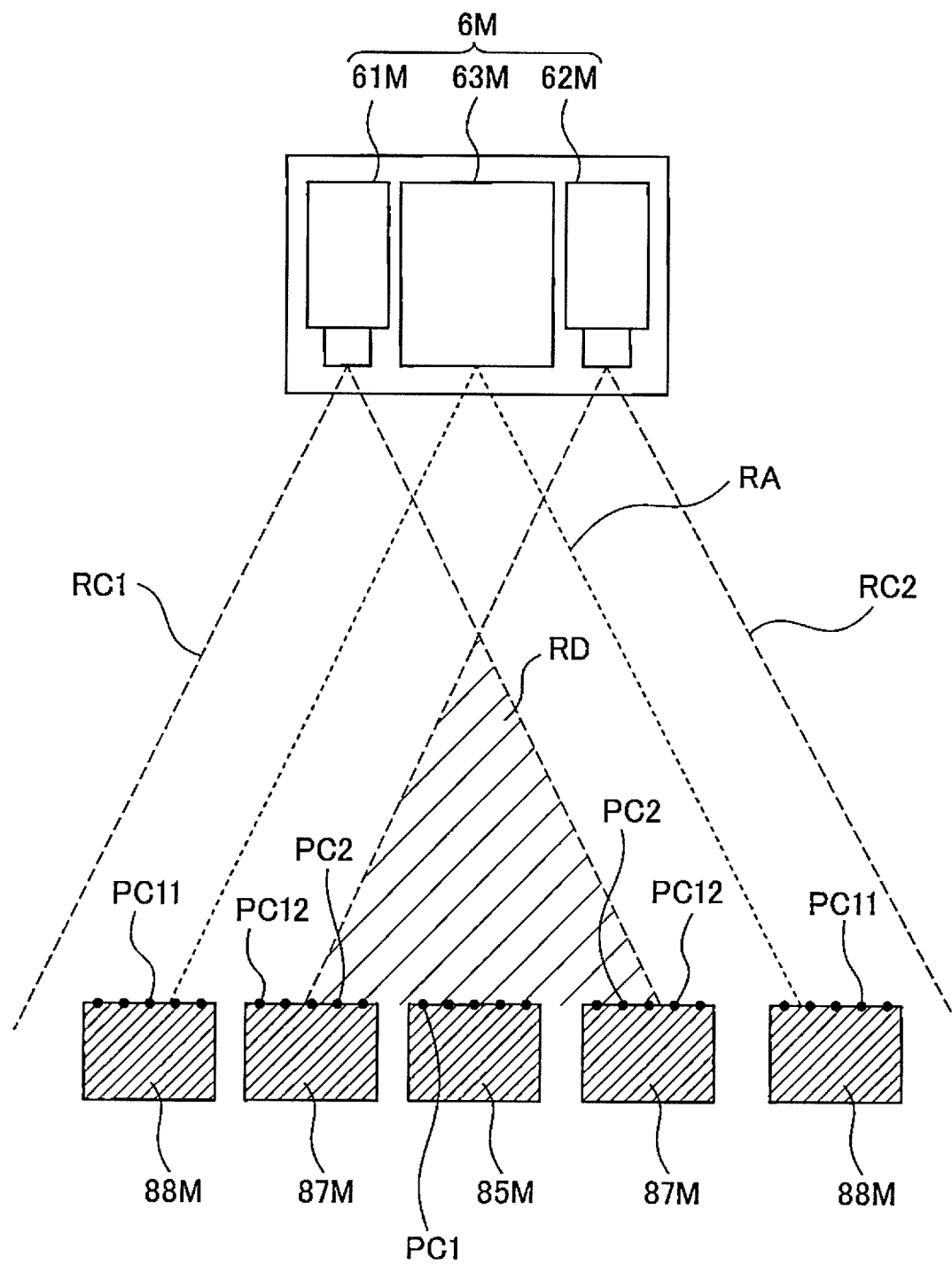
FIG. 18 is a schematic view for explaining an overlap region when the setting points are excluded by the exclusion unit.

FIG. 18 illustrates a schematic view of workpiece models and a range model for explaining exclusion of the setting point. In FIG. 18, the plurality of workpiece models 85M, 87M, 88M are arranged on a pedestal. The projector model 63M projects the pattern light inside a projection range RA. The projection range RA corresponds to the region in which the pattern light is projected by the actual projector 63. Further, the camera model 61M has an imaging range RC1 corresponding to the visual field of the actual two-dimensional camera 61. The camera model 62M has an imaging range RC2 corresponding to the visual field of the actual two-dimensional camera 62. The imaging ranges RC1, RC2 and the projection range RA are predetermined.

The exclusion unit 38 calculates an overlap region RD, which is a region in which the imaging range RC1, the imaging range RC2, and the projection range RA overlap. The workpiece model 85M is arranged inside the overlap region RD, and thus the exclusion unit 38 does not exclude the setting points PCl arranged on the surfaces of the workpiece model 85M. The workpiece model 88M is arranged outside the overlap region RD, and thus the exclusion unit 38 excludes the setting points PC11 arranged on the surfaces of the workpiece model 88M.

A portion of the workpiece model 87M is arranged inside the overlap region RD. Thus, the exclusion unit 38 performs a control for not excluding, among the setting points arranged on the surfaces of the workpiece model 87M, setting points PC2 arranged inside the overlap region RD. On the other hand, the exclusion unit 38 performs a control for excluding the setting points PC12 arranged outside the overlap region RD.

With reference to FIG. 4, this control can be implemented after the setting points are arranged on the surfaces of the workpiece model 85M in step 92. For example, the control can be implemented after the setting points which are not visible from at least one of the camera models 61M, 62M are excluded in step 95. Further, this control can be implemented before the setting points which are not visible from at least one of the camera models 61M, 62M are excluded. Further, the control may be implemented as a step following step 92.

Thus, the exclusion unit 38 can exclude the setting points by taking into consideration the visual fields of the two-dimensional cameras 61, 62 and the projection range of the pattern light of the projector 63. This makes it possible to exclude the setting points arranged in a portion which are not visible from the actual two-dimensional cameras 61, 62 and the setting points arranged in a region where the pattern light is not projected, and thus implement a more accurate simulation.

Note that the workpiece models 87M, 88M arranged outside the overlap region RD exist in the example illustrated in FIG. 18, the workpiece models are not limited to this mode. In the actual robot device, the range sensor 6 may be arranged in a position adequately separated so that all workpieces 85 are disposed inside the overlap region RD. Alternatively, a camera or a range sensor having a performance which allows all workpieces to be arranged inside the overlap region may be used. In these cases, setting points arranged outside the overlap region do not exist, and thus the exclusion unit does not need to perform the control for excluding setting points arranged outside the overlap region.

With reference to FIG. 1, in the actual two-dimensional cameras 61, 62, images corresponding to shapes of actual objects can be captured in a center portion of the captured images. Nevertheless, depending on the performance of the two-dimensional cameras 61, 62, the images may be distorted at an end portion of the image. For example, depending on the performance of the lens of the camera, the shape may be deformed from the actual shape at peripheral portion of the image. The simulation device of the present embodiment can correct the image in accordance with such features of the actual image. The simulation device performs a control for imparting noise which increases in proportion to a distance from the center of the image. For example, a distance correction unit 39 of the simulation device 3 performs the control for imparting a large error to the distance at setting points arranged at the end portion of the captured image.

With reference to FIG. 2, the simulation device 3 of the present embodiment includes the distance correction unit 39 which corrects the distance from the three-dimensional sensor model to the setting points included in the three-dimensional information. The distance correction unit 39 corrects the distance Z of the setting points PC1 included in the three-dimensional information. The distance correction unit 39 can perform a control for increasing a correction amount in proportion to a length from the optical axis of one camera model to the setting point.

Figure 19:
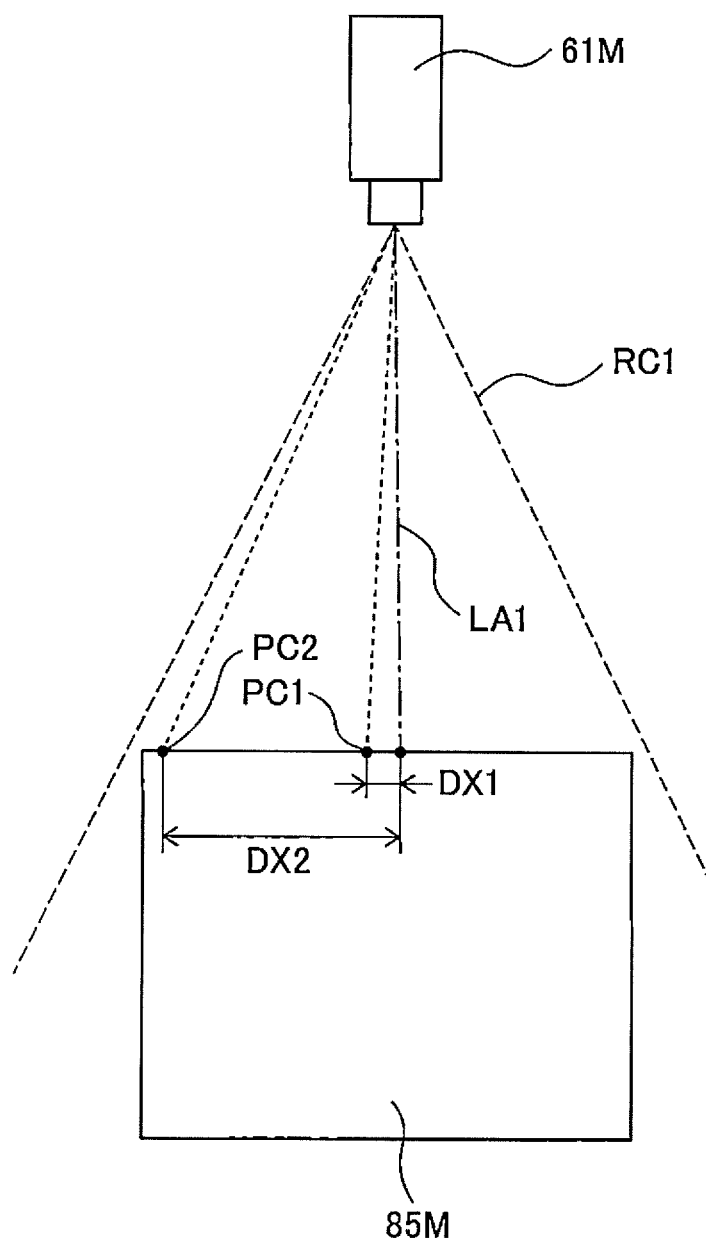
FIG. 19 is a schematic view for explaining correction of a distance of the setting point arranged on a surface of the workpiece model.

FIG. 19 illustrates a schematic view for explaining the control of the distance correction unit. In FIG. 19, of the two camera models 61M, 62M, the one camera 61M is illustrated. The distance correction unit 39 selects one of the setting points PC1 included in the three-dimensional information. The distance correction unit 39 calculates a length DX1 between the optical axis LA1 of the camera model 61M and the setting point PC1. Then, the distance correction unit 39 corrects the distance Z (refer to FIG. 11) between the setting point PC1 and the range sensor model 6M. For example, a coefficient corresponding to the length DX1 can be multiplied by the distance Z of the setting point PC1. The distance correction unit 39 can perform the control for increasing the correction amount (noise) in proportion to the length from the optical axis LA1 to the setting point. For example, a length DX2 from the optical axis LA1 to the setting point PC2 of the workpiece model 85M is greater than the length DX1. Thus, the distance correction unit 39 sets the correction amount of the distance Z of the setting point PC2 to a value greater than the correction amount of the distance Z of the setting point PC1.

The correction of the distance by the distance correction unit 39 is not limited to the method of multiplying a coefficient by the distance Z from the range sensor model 6M to the setting point, and any control for correction may be implemented. For example, the correction amount corresponding to the length from the optical axis LA1 may be determined in advance. Then, the correction amount may be added to or subtracted from the distance Z of the setting point. Such a coefficient or correction amount can be determined in advance in accordance with the performance of the camera.

The distance correction unit 39 can implement a correction in relation to the camera model 61M and a correction in relation to the camera model 62M for one setting point. That is, the distance correction unit 39 can control the correction of the distance Z with respect to the camera model 61M and the camera model 62M. For example, the distance correction unit 39 can correct the distance Z with respect to the camera model 61M, and subsequently correct the distance Z with respect to the camera model 62M.

With reference to FIG. 4, the correction of the distance Z by the distance correction unit 39 can be implemented before the process of detecting the surfaces of the workpiece model in step 96. For example, the correction of the distance Z can be implemented in a process following the process of excluding a portion of the setting points in step 95. Alternatively, the correction of the distance Z may be implemented in a process following the process of calculating the distance Z of the setting point in step 93.

The projector of the present embodiment projects a stripe pattern light, but the pattern light is not limited to this mode. For the pattern of light projected by the projector, any pattern such as a dot pattern or a slit pattern can be employed. Further, while the three-dimensional sensor in the present embodiment includes the projector, the three dimensional sensor does not need to include the projector.

The control for arranging the setting points on the surfaces of the workpiece model is not limited to the above-described method of using the intersecting lines of the first planes and the second planes, and any control may be used. For example, when the pattern of light projected by the projector is a dot pattern, a line passing through a position of a dot projected in the measurement region and the lens center point of the projector can be calculated. Then, the intersecting point of this line and the surface of the workpiece model can be set as a setting point. Further, when the three-dimensional sensor does not include a projector, the measurement region can be set by using the same method as in the present embodiment, and passing points can be set at equal intervals on this measurement region. Then, a line passing through this passing point and the lens center point of the projector model is calculated. The intersecting point of this line and the surface of the workpiece model can be set as a setting point.

In the present embodiment, the transport of a workpiece is illustrated as an example of an operation performed by the robot device, but the operation is not limited to this mode. The present invention can be applied to any operation requiring acquisition of the position and orientation of a workpiece. For example, the present invention can be applied to assembly of a workpiece or welding of a workpiece.

According to an aspect of the present disclosure, in the simulation device that simulates an operation of a robot, the accuracy of the simulation can be improved.

In each control described above, the sequence of steps may be changed as appropriate, within such a range that the functionality and action are not changed. The embodiments described above may be combined as appropriate. In each of the diagrams described above, the same or equivalent parts are appended with the same reference numerals. Note that the embodiments described above are merely examples and do not limit the invention. The embodiments also encompass modifications to the embodiments within the range of the claims.

The invention claimed is:

1. A simulation device that simulates an operation performed on a workpiece by a robot on the basis of three-dimensional information of the workpiece obtained by a three-dimensional sensor provided with two two-dimensional cameras, the simulation device comprising:
a processor configured to:
generate a robot model expressing the robot three-dimensionally, a workpiece model expressing the workpiece three-dimensionally, and a three-dimensional sensor model including camera models expressing the two-dimensional cameras three-dimensionally, in a virtual space,
arrange a plurality of setting points on a surface of the workpiece model,
calculate distances from the three-dimensional sensor model to each of the setting points,
generate three-dimensional information including positions of the setting points and distances from the three-dimensional sensor model to the setting points,
determine among the setting points arranged on the surface of the workpiece model:
visible setting points that are on the surface of the workpiece and are visible on the surface of the workpiece from both of the two-dimensional cameras, and
non-visible setting points that are on the surface of the workpiece and are visible on the surface of the workpiece from a first one of the two-dimensional cameras, and not visible on the surface of the workpiece from a second one of the two-dimensional cameras,
exclude, from the three-dimensional information, the non-visible setting points, calculate a position and orientation of the workpiece model based on the three-dimensional information including on the basis of the positions of the visible setting points and distances from the three-dimensional sensor model to the visible setting points, and excluding the non-visible setting points, and
change a position and orientation of the robot model and implement simulation of an operation performed on the workpiece model on the basis of the position and orientation of the workpiece model.

2. The simulation device according to claim 1, wherein the three-dimensional sensor includes a projector which projects a pattern light onto the workpiece, and
the processor is further configured to:
generate a projector model expressing the projector three-dimensionally in the virtual space, and exclude the setting point arranged outside a region where imaging ranges of the camera models corresponding to visual fields of the two-dimensional cameras overlap with a projection range of the projection model corresponding to a region where the projector projects the pattern light.

3. The simulation device according to claim 1, wherein the processor is further configured to:

correct a distance from the three-dimensional sensor model to the setting point such that a correction amount increases in proportion to a length from an optical axis of the camera model to the setting point.

4. The simulation device according to claim 1, wherein the processor is further configured to:

calculate a line of sight from the camera model to the setting point, and exclude the setting point when an intersecting point of the surface of the workpiece model and the line of sight exists between the setting point and the camera model.

* * * * *

UNITED STATES PATENT AND TRADEMARK OFFICE
CERTIFICATE OF CORRECTION

PATENT NO. : 11,446,822 B2
APPLICATION NO. : 16/266747
DATED : September 20, 2022
INVENTOR(S) : Hiroyuki Atohira It is certified that error appears in the above-identified patent and that said Letters Patent is hereby corrected as shown below:

In the Claims

Claim 1, Column 14, Lines 53-54, delete "on the basis of"

Signed and Sealed this
Twenty-seventh Day of December, 2022

Katherine Kelly Vidal
*Director of the United States Patent and Trademark Office*